United States Patent
Furuse et al.

(10) Patent No.: US 6,914,005 B2
(45) Date of Patent: Jul. 5, 2005

(54) PLASMA ETCHING METHOD

(75) Inventors: Muneo Furuse, Kudamatsu (JP); Mitsuru Suehiro, Kudamatsu (JP); Hiroshi Kanekiyo, Kudamatsu (JP); Kunihiko Koroyasu, Kudamatsu (JP); Tomoyuki Tamura, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 301 days.

(21) Appl. No.: 10/085,002

(22) Filed: Mar. 1, 2002

(65) Prior Publication Data

US 2003/0166343 A1 Sep. 4, 2003

(51) Int. Cl.$^7$ ...................... H01L 21/302; H01L 21/461
(52) U.S. Cl. .................... 438/706; 438/707; 438/708; 438/709; 438/710; 438/711; 438/714
(58) Field of Search ................................ 438/706–725

(56) References Cited

U.S. PATENT DOCUMENTS

| | | | | | |
|---|---|---|---|---|---|
| 5,284,544 A | * | 2/1994 | Mizutani et al. | ....... | 156/345.38 |
| 5,518,572 A | * | 5/1996 | Kinoshita et al. | ...... | 156/345.34 |
| 5,534,751 A | * | 7/1996 | Lenz et al. | ............. | 315/111.71 |
| 5,818,040 A | * | 10/1998 | Kinoshita et al. | ........... | 250/251 |
| 6,527,911 B1 | * | 3/2003 | Yen et al. | .............. | 156/345.43 |

\* cited by examiner

*Primary Examiner*—Duy-Vu N. Deo
(74) *Attorney, Agent, or Firm*—Antonelli, Terry, Stout & Kraus, LLP

(57) ABSTRACT

A plasma etching method and apparatus in which a processing gas is supplied from a shower plate arranged on an electrode opposed to an electrode for generating a plasma or a sample toward the sample center, and the gas is transformed into a plasma thereby to etch the sample. RF power is applied between a sample stage and the electrode to apply the energy to charged particles in the plasma to thereby etch the sample. In the process, apart from the incidence of the charged particles to the sample, the charged particles enter also the shower plate of the electrode by application of the RF power. The charged particles entering the processing gas supply holes of the shower plate are neutralized to prevent abnormal discharge on the shower plate and consequently suppress the generation of foreign matter.

14 Claims, 4 Drawing Sheets

PLASMA ETCHING METHOD

BACKGROUND OF THE INVENTION

1. Field of the Invention

The present invention relates to a plasma etching method, or in particular to a plasma etching method suitable for etching a sample by supplying a processing gas from an electrode portion for generating a plasma or a shower plate arranged on the electrode portion in opposed relation to a sample, and transforming the processing gas into a plasma.

2. Description of the Related Art

[Prior Art 1]

A conventional plasma etching apparatus is described in EP210605B1 (JP-B-7-40567) which discloses an etching apparatus of single-wafer parallel flat plate type configured as follows.

A wafer is held in a holder. The wafer is in opposed relation to an electrode with a space not more than 2 cm. The electrode is preferably formed of single crystal silicon having a multiplicity of holes. The processing gas is supplied into a processing chamber through the holes (0.5 mm in diameter) formed in the electrode. The opposed electrode is connected separately to another terminal of the power source. Upon application of a RF voltage between the holder and the electrode, a plasma is generated in the low-pressure gas between them thereby to start the etching process. The electrode is subjected to a shock by ions to substantially the same degree as the wafer. This electrode is much thicker than a standard silicon wafer. The thickness of the electrode is preferably at least 1.8 mm.

This apparatus is used for plasma etching of an oxide. The RF voltage of 230 W is applied to the wafer and the electrode. An oxide is etched using a mixture gas containing fluorine such as a mixture of $CHF_3$ and a small amount of $O_2$. The total pressure of the processing gas is set to 700 mTorr.

The use of the electrode of single crystal silicon having a multiplicity of holes for supplying the processing gas greatly reduces the number of particulates generated, lengthens the service life with an improved durability, and achieves a high etching rate and a very high uniformity.

[Prior Art 2]

Another conventional plasma etching apparatus is described, for example, in Japanese Patent No. 3,066,007. This publication discloses an apparatus in which the gas introduced into a vacuum chamber is transformed into a plasma by the interaction between the electromagnet and the electromagnetic wave introduced into a flat plate by a coaxial cable thereby to process the sample. This apparatus has the following configuration.

A flat plate is arranged in opposed relation to a sample to be processed. The interval between the flat plate and the sample is set to 30 mm or not more than one half of the diameter of the sample. The flat plate is impressed, through a filter, with two frequencies, one from a power source of 300 MHz to 500 MHz inclusive (450 MHz in the case under consideration) for producing a plasma, and the other from a power source of 500 kHz to 30 MHz inclusive (13.56 MHz in the case under consideration). The surface of the flat plate is formed of silicon, and a processing gas is introduced into the vacuum chamber from a plurality of the holes formed in the silicon surface. The electromagnetic wave of the 13.56 MHz power source has the function of adjusting the potential formed between the silicon surface and the plasma. The sample is supplied with an electromagnetic wave of 800 kHz power for controlling the ion energy entering the sample from the plasma.

A silicon oxide film is etched by this apparatus using a mixture gas of argon gas and $C_4F_8$ as a processing gas. The pressure of the processing gas is 2 Pa. The flat plate is supplied with 800 W power from a 450 MHz power source thereby to produce a plasma. The flat plate is also impressed with the power of 300 W from a 13.56 MHz power source in superposition on the power of 450 MHz.

In this apparatus, the active species in the plasma can be controlled independently of the plasma production. Especially, the effect of controlling the active species can be remarkably increased and a highly accurate plasma process can be realized by controlling the interval between the sample and the flat plate, the material on the flat plate and the electromagnetic wave applied in superposition to the flat plate.

[Prior Art 3]

Still another conventional plasma processing apparatus is described in JP-A-11-3799. This publication discloses a plasma processing apparatus comprising a processing chamber including a plasma production unit on a base chamber, an antenna connected with a high-frequency power source, a substrate stage arranged in the processing chamber, a biasing power supply connected to the substrate stage, and a inclined shower plate for controlling the flow of the processing gas supplied into the processing chamber. This publication contains the description to the effect that any of an induction coupled plasma source, a capacitance coupled plasma source and a microwave plasma source is applicable for plasma production.

The inclined shower plate includes a plate of a metal or a dielectric material formed with a multiplicity of holes of small diameter (about $\phi$0.5 to 3 mm) obliquely along the circumferences of circles concentric about the center axis of the plate. As a result, the flow velocity of the processing gas passing through the plasma area has a component in the circumferential direction, and the uniformity, along the circumference, of the active species transported onto the processed substrate is improved.

SUMMARY OF THE INVENTION

The conventional apparatuses described above fail to sufficiently take the discharge generated in the shower plate into consideration. Specifically, in an apparatus with a high-frequency power applied between a sample stage having a wafer mounted thereon and an electrode opposed to the sample stage, as described in Prior Art 1 (EP210605B1; JP-B-7-40567) and Prior Art 2 (Japanese Patent No. 3,066,007), the charged particles of high energy are applied from the plasma to the shower plate mounted on the electrode in the direction perpendicular thereto. On the other hand, a gas chamber is formed between the shower plate and the electrode, and the shower plate is formed with a multiplicity of small holes communicating between the gas chamber and the processing chamber for supplying the processing gas. Some of the charged particles entering the shower plate also enter the gas chamber through the gas supply holes. In the case where the diameter of the gas supply holes is small, a smaller number of charge particles are passed through the shower plate. With the increase in the operating time of the plasma etching apparatus, however, the holes of the shower plate sputtered by the charged particles gradually increase in size, and the number of the charged particles passing through the shower plate increases correspondingly.

A gas pressure higher than that in the processing chamber is maintained in the gas chamber on the back of the shower plate by the conductance of the gas supply holes. With the increase in the number of the charged particles passing through the gas supply holes of the shower plate, therefore, the charged particles cause the processing gas in the gas chamber to transform into a plasma. Upon generation of a plasma in the gas chamber, the back surface of the shower plate and the electrode surface are sputtered, thereby undesirably generating foreign matter. The foreign matter enters the processing chamber together with the processing gas and is deposited on the wafer surface, thereby posing the problem of a wiring failure.

One solution to this problem may be to reduce the diameter of the holes of the shower plate further. In order to secure the gas flow rate required of the process, however, the number of the holes is required to be further increased, with the undesirable result that the production cost of the shower plate is increased.

Prior Art 3 (JP-A-11-3799) concerns an apparatus used for the process including not only the diffusion under a comparatively high pressure (0.1 to 10 Torr) and a large flow rate (500 sccm or more) such as ashing but also the process in the pressure area affected by the flow of the processing gas. This conventional apparatus thus fails to consider the process requiring the incidence of high ion energy to the wafer in the low pressure (10 Pa (0.075 Torr or less)) area, i.e. the pressure area less affected by the flow of the processing gas.

Specifically, in the apparatus disclosed in Prior Art 3, a multiplicity of small holes are formed diagonally along the circumferences of circles concentric about the center axis of the plate. As a result, the flow of the processing gas passing through the plasma area comes to have the component in the circumferential direction thereby to improve the uniformity, along the circumference, of the active species transported onto the object substrate. In the application in the low pressure area, however, the effect of the processing gas flow is reduced and the diffusion is more liable to occur. Nevertheless, the effect of the processing gas flow cannot be entirely eliminated. In view of the fact that a multiplicity of holes are formed diagonally along the circumferences of the circles concentric about the center axis, the gas flows less smoothly at the central portion of the wafer. In the processing chamber, therefore, the product of plasma reaction stagnates at the central portion of the wafer, and the problem of a deteriorated uniformity of the wafer processing arises.

The object of the present invention is to provide a plasma etching method in which the generation of foreign matter on the shower plate is suppressed while at the same time improving the uniformity of processing in the wafer surface.

In order to achieve the object described above, according to one aspect of the invention, there is provided a plasma etching method comprising the steps of:

placing a sample on a sample stage arranged in a processing chamber;

supplying the processing gas toward the center of the sample through a shower plate from the electrode arranged in opposed relation to the sample stage;

generating a plasma in the processing chamber;

applying RF power between the sample stage and the electrode and thus providing the charged particles in the plasma with the energy to enter the sample;

neutralizing the charged particles which have entered the electrode from the plasma generated by the application of the RF power and then have entered the processing gas supply holes of the shower plate, other than the charged particles that have entered the sample; and etching the sample using the plasma.

According to another aspect of the invention, there is provided a plasma etching method, wherein the processing gas is supplied toward the center of the sample in such a manner that the surface of the shower plate is segmented into a plurality of areas, and the processing gas is supplied in the same direction in each of the segmented areas.

According to still another aspect of the invention, there is provided a plasma etching method, wherein the interior of the processing chamber is maintained at the processing pressure of not higher than 10 Pa.

According to yet another aspect of the invention, there is provided a plasma etching method for generating a plasma in a processing chamber and etching a sample using the plasma, comprising the steps of:

supplying a processing gas from a shower plate arranged on the electrode in opposed relation to the sample;

maintaining the processing pressure in the processing chamber at not higher than 10 Pa;

generating a plasma between the sample and the electrode;

neutralizing the charged particles entering a gas chamber formed between the electrode and the shower plate from the plasma; and etching the sample using the charged particles entering the sample from the plasma.

According to a further aspect of the invention, there is provided a plasma etching method for etching a sample under the processing pressure of not higher than 10 Pa, wherein the processing gas is supplied from a position not less than 30 mm and not more than one half of the diameter of the sample in distance from the sample, toward the center of the sample at an inclination angle (θ) smaller than $\tan^{-1}(t/d)$ (where t is the thickness of the shower plate, and d the diameter of the processing gas supply hole) to the surface of the sample.

Other objects, features and advantages of the invention will become apparent from the following description of the embodiments of the invention taken in conjunction with the accompanying drawings.

DETAILED DESCRIPTION OF THE EMBODIMENTS

Figure 1:
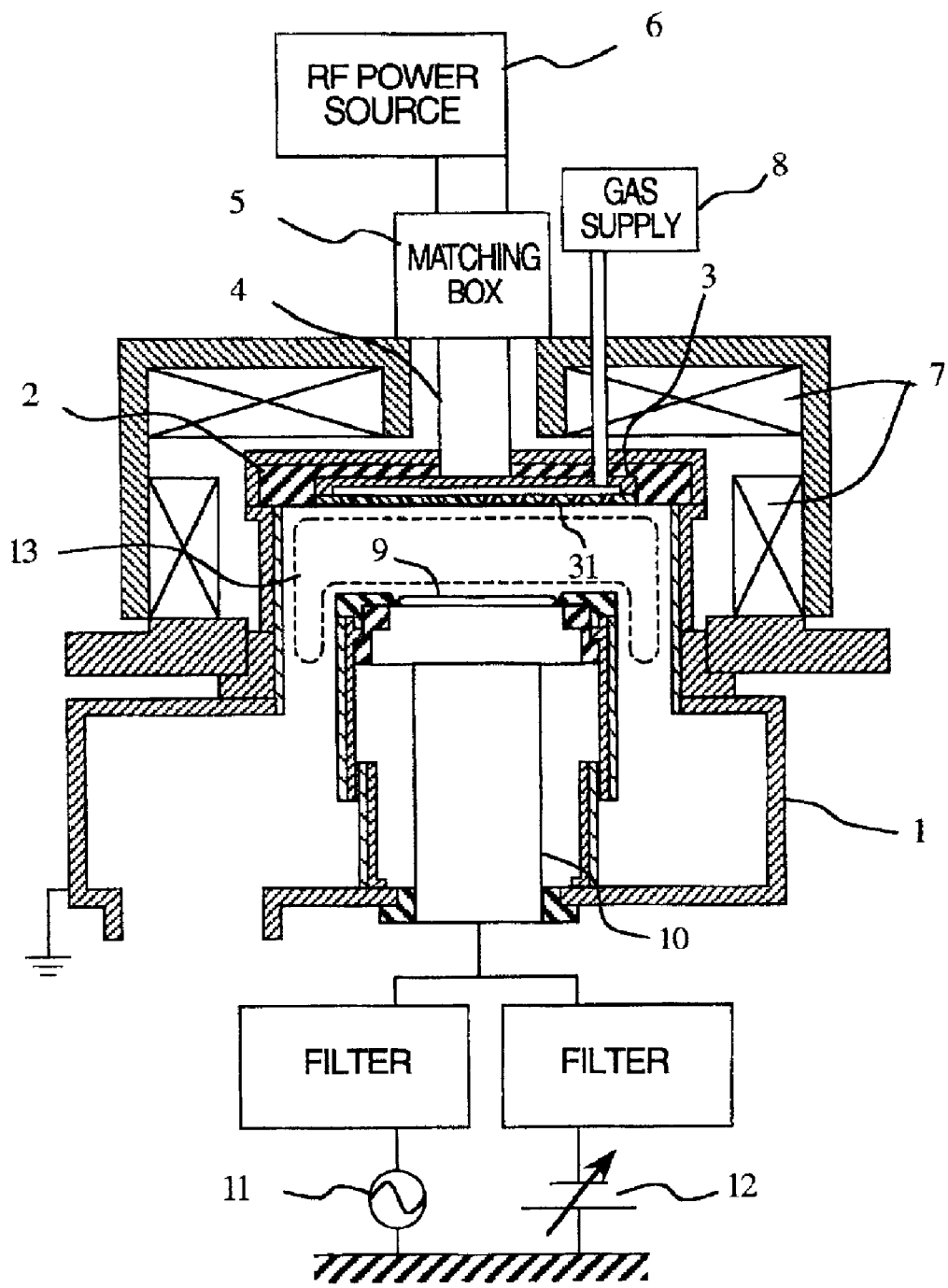
FIG. 1 is a longitudinal sectional view showing an example of a plasma etching apparatus for carrying out a plasma etching method according to an embodiment of the invention.

An embodiment of the invention will be explained below with reference to FIGS. 1 to 5. FIG. 1 shows a plasma etching apparatus used in the invention. This plasma etching apparatus is of ECR type for radiating an electromagnetic wave from an antenna and generating a plasma by the interaction with the magnetic field. An antenna 3 of aluminum is arranged through a dielectric member 2 above a plasma processing chamber, i.e. an etching chamber in tile case under consideration. The antenna 3 is connected, through a coaxial line 4 and a matching box 5, to a RF power source 6 for generating a UHF electromagnetic wave of 450 MHz. The dielectric member 2 inserted between the etching chamber 1 and the antenna 3 can transmit the electromagnetic wave from the RF power source 6. The outer peripheral portion of the etching chamber 1 is wound with solenoid coils 7 for forming a magnetic field in the etching chamber 1. A lower electrode 10 making up a sample stage for mounting a wafer 9 constituting a sample thereon placed is arranged under the antenna 3 in the etching chamber 1. The distance between the antenna (including a shower plate described later) and the lower electrode 10 is adjusted at about 30 mm to 100 mm. The space between the antenna and the lower electrode 10 constitutes a processing space, in which a plasma 13 is generated. The lower electrode 10 is connected with a RF biasing power supply 11 of 800 kHz for attaching energy enabling the ions in the plasma to enter the ion toward the wafer 9 and a DC power source 12 for electrostatically adsorbing the wafer 9 to the lower electrode 10. An exhaust port is arranged at the lower part of the etching chamber 1 and connected with an exhaust unit not shown. Numeral 8 designates a gas supply for supplying the processing gas into the etching chamber 1.

Figure 2:
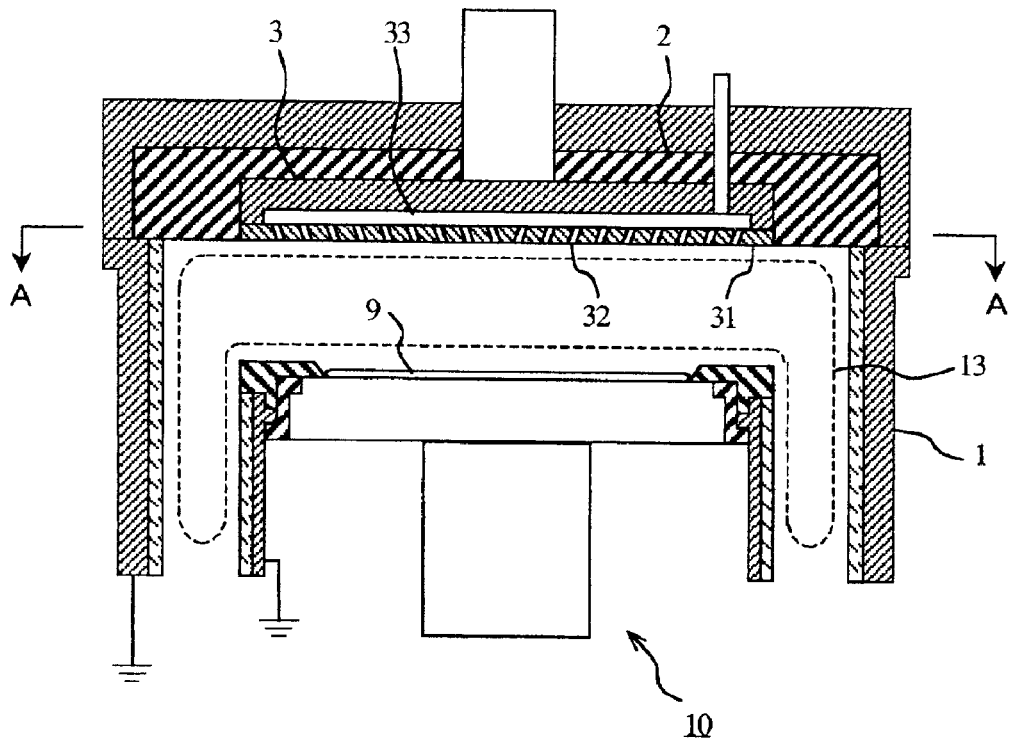
FIG. 2 is a longitudinal sectional view showing in detail a plasma generating unit of the apparatus shown in FIG. 1.
Figure 3:
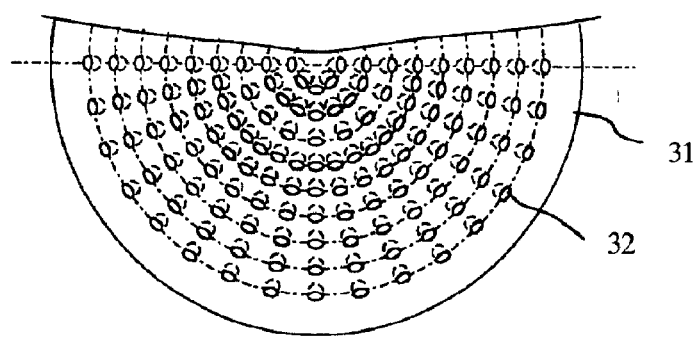
FIG. 3 is a plan view of a shower plate taken along line A—A in FIG. 2.

The lower surface (the surface nearer to the lower electrode 10) of the antenna 3 is provided with a shower plate 31 formed of a conductive material such as silicon or carbon. As shown in FIG. 2, a gas chamber 33 is arranged between the antenna 3 and the shower plate 31. The gas chamber 33 is connected with the gas supply 8. The shower plate 31 includes, as shown in FIG. 3, a multiplicity of gas supply holes 32 inclined toward the center of the wafer 9. The gas supply holes 32 are arranged along a plurality of concentric circles having different diameters, and inclined toward the center at the same angle (θ) shown in FIG. 5. The inclination angle (θ) is formed to the surface of the shower plate 31. Let t be the thickness of the shower plate 31, and d the diameter of the opening of each gas supply hole 32 (substantively, the diameter of the gas supply hole). Then, the angle θ satisfies the relation $\theta < \tan^{-1}(t/d)$.

For example, when the space between the shower plate 31 and the lower electrode 10 is 30 mm and the inclination angle of the gas supply hole 32 is 70 degrees, the diameter of the innermost concentric circle in which the gas supply holes are arranged is set to be approximately 30 mm. Thus, when the gas supply holes are arranged toward the center of the wafer, a portion at which the gas supply holes 32 are not disposed is provided at the center of the shower plate 31, also taking the space between the shower plate 31 and the lower electrode 10 into consideration. Thereby, the on-wafer gas flow can be optimized without leaving the gas at the central potion of the water. In this case, the thickness (t) of the shower plate is 6 mm and the diameter (d) of the gas supply hole is 0.5 mm.

Figure 4:
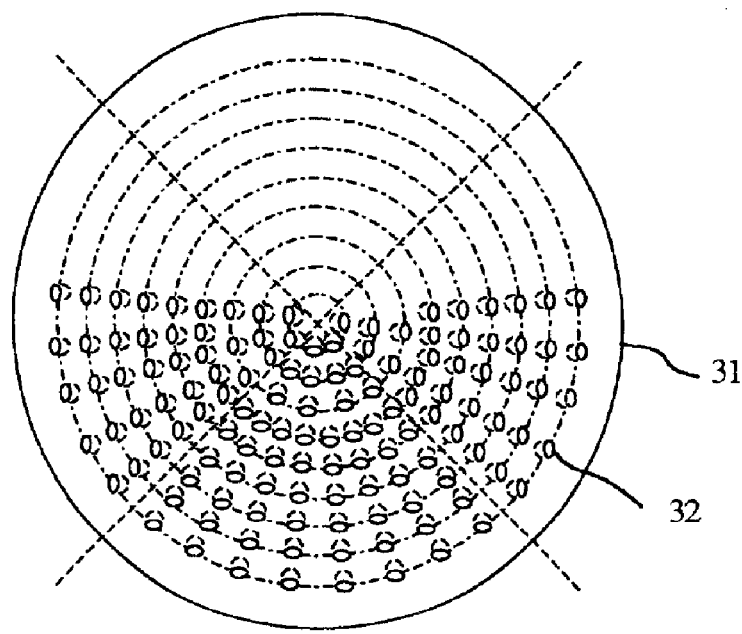
FIG. 4 is a plan view of another example of a shower plate taken along line A—A in FIG. 2.
Figure 5:
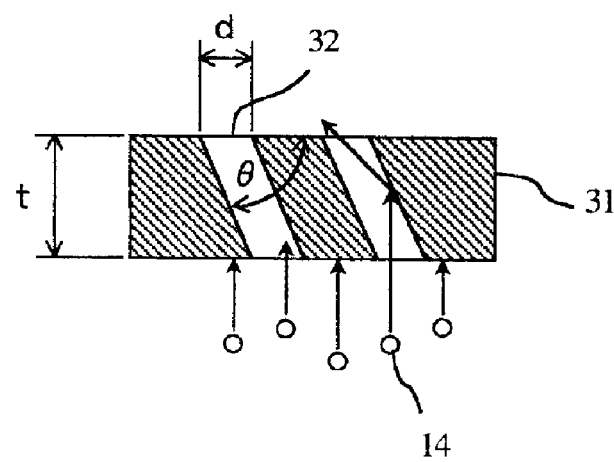
FIG. 5 is a partial sectional view of the shower plate.

In order to reduce the number of manufacturing steps for the shower plate 31, as shown in FIG. 4, the surface of the shower plate 31 is segmented into a plurality of areas, in each of which the gas supply holes are arranged in the same direction thereby to facilitate the hole forming process. In the case under consideration, the surface is segmented into four areas. The lower area representing one fourth of the surface in size is provided with the same gas supply holes directed upward (in the drawing), the right area representing another one fourth in size is provided with the same gas supply holes directed leftward (in the drawing), the left area representing still another fourth in size is provided with the same gas supply holes directed rightward (in the drawing), and the upper area representing a further one fourth in size is provided with the same gas supply holes directed downward (in the drawing). As a result, the holes can be formed changing only a smaller number of directions, and the number of processing steps can be reduced. In this embodiment, the surface is segmented into four areas, to which the invention is not limited. With the increase in the number of areas into which the surface is segmented, the uniformity of the in-plane gas distribution in the processing chamber can be improved further.

In the case of the processing apparatus for processing 8-inch or 12-inch wafers, under the internal pressure of the processing chamber approximately not less than 10 Pa (75 mTorr), the processing gas flow constitutes a viscous flow area and therefore the gas flow is considerably affected by the direction of the gas supply holes. In the case where the pressure is about 0.1 Pa (0.75 mTorr) or less, on the other hand, the processing gas flow constitutes a molecular flow area, and the effect of the direction of the gas supply holes is substantially eliminated. In the case where the pressure in the processing chamber is between 0.1 Pa and 10 Pa, the flow of the processing gas is an intermediate flow, so that the effect of the direction of the gas supply holes is gradually reduced with the drop of pressure.

In the apparatus having the configuration described above, the UHF electromagnetic wave output from the RF power source 6 is supplied to the processing space in the etching chamber 1 from the antenna 3 through the matching box 5, the coaxial line 4 and the dielectric member 2. On the other hand, a magnetic field is formed by the solenoid coil 7 in the internal processing space of the etching chamber 1. By the interaction between the electric field of the electromagnetic wave and the magnetic field of the solenoid coil, the etching gas introduced into the processing space in the etching chamber 1 through the shower plate 31 is transformed into a plasma efficiently. Using this plasma 13, a predetermined etching process is carried out for the wafer 9 above the lower electrode 10. In the etching process, the incident energy of ions in the plasma entering the wafer 9 is controlled by the RF biasing power supply 11 to obtain the desired etching shape. In the process requiring a high bias voltage such as the process for etching an insulating film including a silicon oxide film, the RF output from the RF biasing power supply 11 is required to be at least 1 kW.

Upon application of a RF bias voltage to the lower electrode 10, the plasma potential of the plasma 13 formed in the processing space is increased in synchronism with the period of the RF bias voltage. With the increase in plasma potential, the ions in the plasma 13 enter, with high energy, the antenna 3 constituting the earth electrode as against the lower electrode. In this apparatus, the ions enter the shower plate 31 having the same potential as the antenna 3. Also, upon application of the RF bias voltage to the antenna 3, the charged particles 14 of ions or electrons enter the shower plate 31 from the plasma 13. As a result, the shower plate 31 is consumed under attack of the charged particles 14.

In the conventional shower plate, the gas supply holes are formed in a position perpendicular to the shower plate, i.e. the wafer. With the gradual increase in the gas supply holes under attack of the charged particles, therefore, the charged particles become more liable to find their way into the gas chamber on the back of the shower plate through the gas supply holes. On the other hand, the gas pressure in the gas chamber on the back of the shower plate increases beyond the pressure of the processing space by the conductance of the gas supply holes, thereby facilitating discharging. Upon entry of the charged particles into the gas chamber, therefore, an abnormal discharge occurs in the gas chamber, and the aluminum antenna is exposed to the plasma, with the result that the foreign matter is generated and scattered.

According to this embodiment, the gas supply holes 32 are all inclined at an angle (θ), and therefore the charged particles 14 cannot be passed directly through the gas supply holes 32. The angle (θ) is determined by the relational equation described above. At this angle, one of the openings or the gas supply holes 32 is invisible from the other opening in the direction perpendicular to the wafer. The charged particles 14 that have entered the gas supply holes 32, therefore, impinge upon the inclined surface of the gas supply holes 32 of the shower plate 31 at least once. Since the shower plate 31 is a conductor, the charged particles are neutralized by this bombardment. The processing gas in the gas chamber 33 is not transformed into plasma by the entry of the neutralized charged particles into the gas chamber 33.

Even though the protracted operation of the apparatus may cut the gas supply holes 32, the area of the opening where the charged particles can directly pass through is so small that a sufficiently long service life is maintained before reaching the quantity of the charged particles causing an abnormal discharge.

The gas supply holes 32 are inclined toward the center of the wafer 9, and therefore the gas distribution in the processing space is improved. Specifically, with the apparatus according to this embodiment, the processing pressure is controlled to not more than 10 Pa, or preferably, to 5 Pa to 1 Pa. The processing gas flow under this processing pressure is an intermediate flow, and a small gas flow can be formed in the processing space by the direction of the gas supply holes 32. As a result, in the apparatus exhausted from the periphery of the wafer, the reaction products normally liable to stay at the central portion of the wafer are easily exhausted by being transported to the wafer periphery on the small gas flow. Thus, the distribution of the reaction products on the wafer surface is improved, thereby facilitating the other control operations for the etching process such as the etching shape within the wafer surface.

As described above, according to this embodiment, the gas supply holes of the shower plate arranged on the antenna working as an electrode are formed at a predetermined angle toward the wafer center. Thus, the optimum gas flow can be formed from the shower plate of the antenna portion in opposed relation to the wafer toward the wafer, while at the same time preventing the abnormal discharge which otherwise might be caused between the antenna and the shower plate by the charged particles from the plasma. As a result, the generation of foreign matter in the shower plate can be suppressed, and the uniformity of the processing within the wafer surface can be improved.

This embodiment refers to the processing using an ECR apparatus with the UHF electromagnetic wave. The invention, however, is not specifically confined to this embodiment but applicable to any apparatus which supplies the processing gas from the electrode portion opposed to the lower electrode under the processing pressure of not more than 10 Pa. For example, the apparatuses to which the invention applicable include a plasma processing apparatus of capacitance coupled type, and a plasma processing apparatus of induction coupled type in which a bias voltage is applied to the lower electrode and the opposed surface of the lower electrode constitutes an earth electrode.

Also, the foregoing description of the embodiment deals with a case in which an inclination angle is formed in the gas supply holes of the shower plate. In the case where the abnormal discharge between the electrode and the shower plate is prevented, however, a similar effect can be achieved with the gas supply holes shown in FIGS. 6 to 8.

Figure 6:
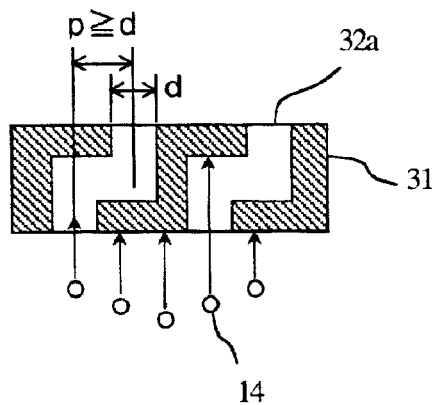
FIG. 6 is a partial sectional view showing the shower plate according to another embodiment.

The gas supply holes 32a shown FIG. 6 are such that the center distance (p) between one opening and the other opening is longer than the diameter (d) of the gas supply hole. In this case, the gas supply holes 32a can be formed in such a manner that a plate performed with a path for establishing communication of each hole is held by a plate formed with each hole. In this way, the charged particles 14 always impinge on the path for establishing communication of the holes and are neutralized.

Figure 7:
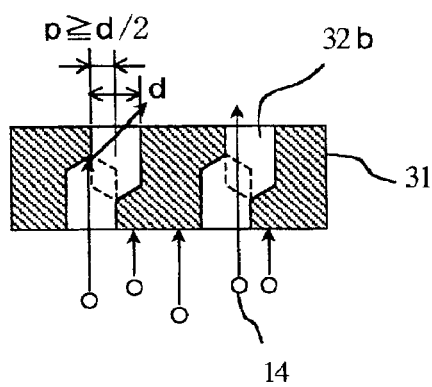
FIG. 7 is a partial sectional view showing the shower plate according to still another embodiment.

The gas supply holes 32b shown in FIG. 7 are formed in such a manner that the center distance (p) between one hole and the other hole is not less than one half of the diameter of the gas supply hole (d), and each hole is provided with an overlapped portion for establishing communication. In this case, the charge particles 14 directly pass through some portions. Since the number of the charged particles that can so pass is greatly reduced, however, the abnormal discharge is suppressed.

Figure 8:
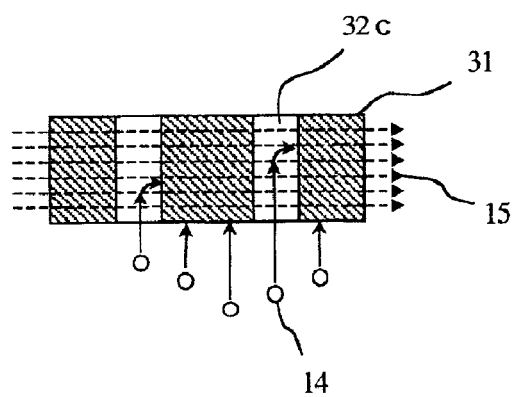
FIG. 8 is a partial sectional view showing the shower plate according to yet another embodiment.

Further, the gas supply holes 32c shown in FIG. 8 are perpendicular to the surface of the shower plate 31. By forming a magnetic field 15 parallel to the surface of the shower plate 31, the charged particles 14 are restricted by the magnetic field 15, and thus changing their direction, neutralized by impinging on the side surface of the gas supply holes 32.

This embodiment has the following additional features:
(1) A plasma etching method comprising the steps of:
generating a plasma in a processing chamber with a sample placed therein;
supplying a processing gas toward the center of the sample through a shower plate from the earth electrode of the ground potential arranged in opposed relation to the sample;
applying a RF bias of not more than 2 MHz in frequency to the sample; and
etching the insulating film formed on the sample using the plasma.
(2) A plasma etching method, wherein the processing gas is supplied obliquely toward the center of the sample from the circumference of the shower plate.
(3) A plasma etching method, wherein the plasma is generated by use of an electromagnetic wave of 300 MHz to 500 MHz in frequency.
(4) A plasma etching method, wherein the plasma is generated by the operation of the electromagnetic wave and a magnetic field.
(5) A plasma etching method, wherein the insulating film is etched under the processing pressure of not more than 10 Pa.
(6) A plasma etching method, wherein the insulating film is an organic insulating film.
(7) A plasma etching method comprising the steps of:
generating a plasma in a processing chamber with a sample placed therein;
supplying a processing gas toward the center of the sample through a shower plate from an electrode arranged in opposed relation to the sample;

applying a RF bias of not more than 2 MHz in frequency to the sample; and etching the insulating film formed on the sample using the plasma.

(8) A plasma etching method, wherein a RF voltage not lower than 13.56 MHz is applied to the electrode.

(9) A plasma etching method, wherein RF power of different frequencies are applied to the electrode.

(10) A plasma etching apparatus for generating a plasma in a processing chamber and etching a sample using the plasma, comprising:

a sample stage arranged in the processing chamber for mounting the sample;

an electrode arranged in opposed relation to the sample stage in the processing chamber;

a RF power supply for supplying RF power between the sample stage and the electrode; and a shower plate arranged on the side of the electrode opposed to the sample for supplying the processing gas to the inner side of the sample;

wherein the inclination angle ($\theta$) of the processing gas supply holes formed in the shower plate is set to the surface of the shower plate in such a manner as to satisfy the relation $\theta < \tan^{-1}(t/d)$, where t is the thickness of the shower plate and d is the diameter of the processing gas supply holes.

(11) A plasma etching apparatus, wherein the processing gas supply holes directed toward the center of the sample are such that the surface of the shower plate is segmented into a plurality of surface areas and the processing gas supply holes within each of the segmented surface areas are inclined in the same direction.

(12) A plasma etching apparatus, wherein the interior of the processing chamber is maintained at a pressure of not more than 10 Pa.

(13) A plasma etching apparatus, wherein the RF power supply is for generating a plasma.

(14) A plasma etching apparatus, wherein the RF power supply for applying a bias voltage.

It will thus be understood from the foregoing description that according to the invention, the generation of foreign matter on the shower plate can be suppressed, while at the same time improving the uniformity of the processing within the wafer surface.

It should be further understood by those skilled in the art that the foregoing description has been made on embodiments of the invention and that various changes and modifications may be made in the invention without departing from the spirit of the invention and the scope of the appended claims.

What is claimed is:

1. A plasma etching method comprising:

placing a sample on a sample stage arranged in a processing chamber;

supplying a processing gas toward a center of the sample from a shower plate associated with an electrode arranged in opposed relation to the sample stage, the shower plate having processing gas supply holes and being provided to a lower surface of the electrode which is closest to the sample stage;

generating plasma in the processing chamber;

applying RF power between the sample stage and the electrode for providing energy enabling charged particles in the plasma to enter the sample;

neutralizing errant charged particles which enter the processing gas supply holes from the plasma during a period of RF power, by bombardment of the errant charged particles against an inner surface of the processing gas supply holes, the errant charged particles being other than the charged particles that have entered the sample; and etching the sample using the plasma.

2. A plasma etching method according to claim 1, wherein the processing gas is supplied toward the center of the sample in such a manner that the shower plate is segmented into a plurality of areas, and the processing gas is supplied in a same direction in each of the segmented areas.

3. A plasma etching method according to claim 1, wherein an interior of the processing chamber is maintained at a processing pressure of not higher than 10 Pa.

4. A plasma etching method for generating plasma in a processing chamber and etching a sample using the plasma, comprising:

supplying a processing gas from a gas chamber formed between an electrode being in opposed relation to the sample, and a shower plate which is arranged in a surface of the electrode closest to a sample stage;

maintaining a processing pressure in the processing chamber at not higher than 10 Pa;

generating a plasma in a processing space formed between the sample and the electrode by a plasma generating means;

neutralizing errant charged particles attempting to enter from the plasma to the gas chamber formed between the electrode and the shower plate, by causing the errant charged particles to be impinged upon an inner surface of gas supply holes of the shower plate; and etching the sample using the charged particles entering the sample from the plasma.

5. A plasma etching method for etching a sample under a processing pressure of not higher than 10 Pa, wherein a processing gas is supplied from a position not less than 30 mm and not more than one half of a diameter of the sample in distance from the sample, toward a center of the sample through processing gas supply holes having an inclination angle ($\theta$) to a surface of the sample, smaller than $\tan^{-1}(t/d)$, where t is a thickness of a shower plate, and d is a diameter of a processing gas supply hole.

6. A plasma etching method according to claim 1, wherein the bombardment of the errant charged particles against an inner surface of the processing gas supply holes is effected by inclination of the processing gas supply holes to eliminate or reduce an area of a perpendicular path through the shower plate.

7. A plasma etching method according to claim 1, wherein the bombardment of the errant charged particles against an inner surface of the processing gas supply holes is effected by having processing gas supply holes formed by a first bore extending inward from a first major planar surface of the shower plate and a second bore extending inward from an opposing major planar surface of the shower plate such that the processing gas can flow between the first bore and second bore, where axes of the first bore and second bore are offset from one another to eliminate or reduce an area of a perpendicular path through the shower plate.

8. A plasma etching method according to claim 1, wherein the bombardment of the errant charged particles against an miner surface of the processing gas supply holes is effected by application of a biasing magnetic field through the shower plate at least partially parallel to major planar surfaces of the shower plate, to bias travel of the errant charged particles into collision with the inner surface of the processing gas supply holes.

9. A plasma etching method according to claim 4, wherein the causing of the errant charged particles to be impinged upon an inner surface of gas supply holes of the shower plate s effected by inclination of the processing gas supply holes to eliminate or reduce an area of a perpendicular path through the shower plate.

10. A plasma etching method according lie claim 4, wherein the causing of the errant charged particles to be impinged upon an inner surface of gas supply holes of the shower plate is effected by having processing gas supply holes formed by a first bore extending inward from a first major planar surface of the shower plate and a second bore extending inward from an opposing major planar surface of the shower plate such that the processing gas can flow between the first bore and second bore, where axes of the first bore and second bore are offset from one another to eliminate or reduce an area of a perpendicular path through the shower plate.

11. A plasma etching method according to claim 4, wherein the causing of the errant charged particles to be impinged upon an inner surface of gas supply holes of the shower plate is effected by application of a biasing magnetic field through the shower plate at least partially parallel to major planar surfaces of the shower plate, to bias travel of the errant charged particles into collision with the inner surface of the processing gas supply holes.

12. A plasma etching method according to claim 5, wherein inclination of the processing gas supply holes eliminates or reduces an area of a perpendicular path through the shower plate.

13. A plasma etching method according to claim 5, wherein other processing gas supply holes are formed by a first bore extending inward from a first major planar surface of the shower plate and a second bore extending inward from an opposing major planar surface of the shower plate such that the processing gas can flow between the first bore and second bore, where axes of the first bore and second bore are offset from one another to eliminate or reduce an area of a perpendicular path through the shower plate.

14. A plasma etching method according to claim 5, comprising application of a biasing magnetic field through the shower plate at least partially parallel to major planar surfaces of the shower plate, to bias travel of the errant charged particles into collision with the inner surface of the processing gas supply holes.

* * * * *